United States Patent [19]
Jiang

[11] Patent Number: 5,856,949
[45] Date of Patent: Jan. 5, 1999

[54] CURRENT SENSE AMPLIFIER FOR RAMS

[75] Inventor: Chongjun Jiang, Dallas, Tex.

[73] Assignee: Advanced Micro Devices, Inc., Sunnyvale, Calif.

[21] Appl. No.: 813,731

[22] Filed: Mar. 7, 1997

[51] Int. Cl.[6] ............................ H01L 29/10; H03K 3/356
[52] U.S. Cl. ........................ 365/203; 365/204; 365/205; 365/202
[58] Field of Search ................................ 365/189.1, 208, 365/145, 203, 204, 202, 205; 257/67

[56] References Cited

U.S. PATENT DOCUMENTS

| | | | |
|---|---|---|---|
| 4,716,320 | 12/1987 | McAdams | 307/530 |
| 5,422,499 | 6/1995 | Manning | 257/67 |
| 5,487,029 | 1/1996 | Kuroda | 365/145 |

OTHER PUBLICATIONS

A 400MHz, 300mW, 8kb, CMOS SRAM Macro with a Current Sensing Scheme, by Izumikawa, M. et al., IEEE 1994 Custom Integrated Circuits Conference, pp. 595–598, May 1994.

*Primary Examiner*—Viet Q. Nguyen
*Attorney, Agent, or Firm*—Rita M. Wisor

[57] ABSTRACT

An improved sense amplifier for RAM arrays is provided which reduces read operation access times, reduces static power consumption and reduces used silicon area. The improved sense amplifier includes an equalizing operation that brings the voltages on the output lines to a midpoint voltage prior to performing a read operation. By providing a midpoint voltage on the output lines, neither output line needs to transition a full rail from Vss to Vcc or vice versa during the amplifying operation, decreasing the amount of time required to read the memory cells.

13 Claims, 4 Drawing Sheets

CURRENT SENSE AMPLIFIER FOR RAMS

BACKGROUND OF THE INVENTION

1. Field of the Invention

This invention relates to improvements to sense amplifiers for random access memories.

2. Background

Random Access Memories (RAMs) are very common storage devices in high technology products. RAMs comprise cache memories in many computers, both internal to the processor and on the computer motherboard. Typically RAMs are arranged as arrays of individually addressable memory cells. The cells are organized in rows and columns. For example, an 8k RAM chip, which has 8k memory cells, is typically an array of 1024 rows by 8 columns.

FIG. 1 shows column M of a typical N row RAM array. Cells M1 through MN are data storage units, typically comprised of flip flops optimized for reduced power consumption and area. Each row of cells has a row select line. The first cell of each column is connected to Row Select 1, and the Nth cell of each row is connected to Row Select N. Each column of cells also has a column select line. All of the cells in Column M have Column Select M (not shown), and all of the cells in Column (M+1) have Column Select (M+1). By selectively asserting row and column selects, each cell can be individually addressed.

The cells in each column are connected to a column bit line and an inverse column bit line. All cells in column M are connected to a column bit line MBIT and an inverse column bit line MBITX, MBITX having the inverse value of MBIT during read and write operations. During a read operation of a cell in Column M, the cell places the stored data value, either a logic one or a logic zero, on the MBIT line and places the inverse of the stored data value on the MBITX line. For example, if the stored value in the cell is a logic one, the cell places logic one on the MBIT line and logic zero on the MBITX line. During a write operation to a cell in Column M, the value to be written into the cell is placed on the MBIT line and the inverse of the value to be written is placed on the MBITX line. For example, if the value to be written is a logic zero, logic zero is placed on the MBIT line and logic one is placed on the MBITX line.

During a read operation, a sense amplifier connected to each column senses the difference in voltage or current between the MBIT and MBITX lines, amplifies the result, and places the result onto the MOUT and MOUTX lines. The typical sense amplifier senses the difference (either in voltage or current) of the lines on the corresponding MBIT and MBITX lines. The magnitude of the voltage difference in the MBIT and MBITX lines is typically a function of the RAM cell drain current and bit line capacitance. However, the magnitude of the current difference in the MBIT and MBITX lines is typically not dependent on the bit line capacitance. The sense amplifier amplifies to standard output levels the line difference, and the resulting difference is reflected on the MOUT and MOUTX lines. The MOUT line reflects the value stored in the memory cell and the MOUTX line reflects the inverse of the same value.

Referring to FIG. 1, two PMOS transistors, T1 and T2, act as loads for the MBIT and MBITX lines, establishing a near Vcc voltage on each line when the transistors T1 and T2 are on. The source nodes of T1 and T2 are connected to Vcc (power) and the drain nodes are connected to MBIT and MBITX, respectively. The gate nodes of T1 and T2 are connected together and connected to a PCHG (precharge) line.

PCHG is active typically when no write operation is occurring. By precharging the bit lines, the effect of the bit line capacitance on voltage is reduced during reads of the memory cell values to decrease the amount of time for the MBIT and MBITX lines to reach the correct values, thereby decreasing access times.

As the number of rows in a RAM array increase as memories get larger with newer semiconductor technologies, the MBIT and MBITX line capacitance increases. Each bit line interfaces with many cells, and consequently has parasitic capacitance much larger than the cell capacitance. When the cell is selected, the charge stored in the cell is shared with the parallel bit line capacitance, creating only a small difference on the MBIT and MBITX lines. A sense amplifier is designed to sense the small differences in current or voltage of the bit lines and amplify the difference to normal logic levels. For sense amplifiers that read directly from the MBIT and MBITX lines, the increased line capacitance of very large RAM arrays creates decreased voltage differences, causing an increase in the detection time and hence an increase in the access time. A sense amplifier that is independent of the line capacitance is needed for very large and fast RAM arrays.

FIG. 2 shows a typical prior art current sense amplifier circuit that typically operates independent of the bit line capacitances. Transistors T5, T6, T8 and T9 perform the sense operation. Transistors T3, T4, T5, and T6 perform the amplify operation. The column bit lines are ABIT and ABITX.

The prior art current sense amp of FIG. 2 is typically used in the RAM array configuration of FIG. 1. The bit lines ABIT and ABITX connect to the bit lines MBIT and MBITX of FIG. 1, respectively. A read enable line, ARE, of FIG. 2 connects to the MRE line of FIG. 1. An ARWX line (Not Read Enable and Not Write Enable) of FIG. 2 is formed by logically ANDing the inverse of the ARE line with the inverse of the MWE line.

The source node of PMOS transistor T5 is connected to the ABIT line. The drain node of T5 is connected to the drain node of NMOS transistor T3 and to an AOUT line. The gate nodes of T3 and T5 are connected together and to an AOUTX line.

The source node of PMOS transistor T6 is connected to the ABITX line. The drain node of T6 is connected to the drain node of NMOS transistor T4 and to the AOUTX line. The gate nodes of T4 and T6 are connected together and to the AOUT line.

The source nodes of T3 and T4 are connected to the drain node of NMOS transistor T7. The source node of T7 is connected to Vss (ground). The gate node of T7 is connected to a read enable line, ARE.

The drain node of NMOS transistor T8 is connected to the AOUT line. The drain node of NMOS transistor T9 is connected to the AOUTX line. The source nodes of T8 and T9 are connected to Vss. The gate nodes are T8 and T9 are connected together and connected to the ARWX line. The ARWX line is active only when there is not an active read or write operation occurring.

Prior to a read operation and not during a write operation, the ARE line is low, the ARWX line is high and the bit lines ABIT and ABITX are precharged to approximately Vcc by the PCHG line through the transistors T1 and T2 of FIG. 1. T8 and T9 are turned ON by the ARWX line while T7 is turned OFF by the ARE line. As a result, the output lines AOUT and AOUTX are pulled down to approximately Vss through T8 and T9.

The row and column selects become active, selecting a particular memory cell, starting the sensing operation. As shown in FIG. 2, the difference between the current I1 which flows through T5 and T8 and the current I2 which flows through T6 and T9 depends on the value of the data in the memory cell and may be expressed as ΔI. The resulting voltage difference between the output lines AOUT and AOUTX may be expressed as ΔV. The gate voltage of T6 is raised by ΔV, I2 is consequently reduced, and the ΔV increases.

The ARE line transitions high, causing the ARWX line to transition low, starting the amplifying operation. T8 and T9 turn OFF, T7 turns ON. The cross-coupled inverter circuit (T3, T4, T5 and T6) amplifies ΔV to the standard output level. For example, if the value in the memory cell is a logic one, the ABIT line voltage will be greater than the ABITX line voltage. This causes T5 to be ON, T3 to be OFF, T6 to be OFF and T4 to be ON. Since the AOUT and AOUTX lines were pulled down prior to the start of the read operation, at least one of the lines must transition the full rail to Vcc.

The prior art sense amplifier of FIG. 2 reduces the effect of bit line capacitance on the access times of the RAM array by sensing the difference in current on the ABIT and ABITX lines. However, access times are limited by the time it takes for AOUT or AOUTX to transition the full rail from logic zero to logic one. In addition, the prior art sense amplifier uses significant amounts of silicon area, seven transistors per sense amplifier, and one sense amplifier per column in the RAM array. The prior art sense amplifier also uses significant amounts of power when not performing a read operation. When ARE is not active (i.e., when no read operation is active) T8 and T9 are ON, with large amounts of current flowing through the transistors.

SUMMARY OF THE INVENTION

The present invention is an improved current sense amplifier with improved read access times, reduced silicon area and optimized power dissipation, facilitated by an equalizing circuit.

The equalizing circuit brings the voltage on the output lines of the sense amplifier to a midpoint voltage (approximately halfway between Vcc and Vss) prior to a read operation. Read operations are completed in less time since neither output line needs to transition rail to rail (from Vss to Vcc or vice versa). In addition, since the transistors are not fully ON when not reading or writing, the overall static power consumption is reduced. The invention also uses fewer transistors than conventional methods thereby reducing the used silicon area.

A further understanding of the nature and advantages of the present invention may be realized by reference to the remaining portions of the specification and the drawings.

BRIEF DESCRIPTION OF THE DRAWINGS

So that the manner in which the above recited advantages and features of the present invention, as well as others which will become apparent, are attained and can be understood in detail, a more particular description of the invention summarized above may be had by reference to the embodiment thereof which is illustrated in the appended drawings, which drawings form a part of this specification. It is to be noted, however, that the appended drawings illustrate only typical embodiments of the invention and are therefore not to be considered limiting of its scope, for the invention may admit to other equally effective embodiments.

DETAILED DESCRIPTION OF PREFERRED EMBODIMENTS

The described invention is a preferred embodiment of an improved current sense amplifier that improves the access time, optimizes power dissipation and reduced area over conventional sense amplifiers by utilizing an equalizing circuit across the output lines of the sense amplifier. The equalizing circuit brings the voltage levels on the output data lines to a midpoint voltage during all times when a read operation is not active. During a read operation, starting at a midpoint voltage, the output lines do not need to transition the full rail Vss to Vcc. Each line only transitions half a rail, improving RAM access times during a read operation, effectively cutting transition times in half over prior art sense amplifiers, decreasing access times.

Figure 3:
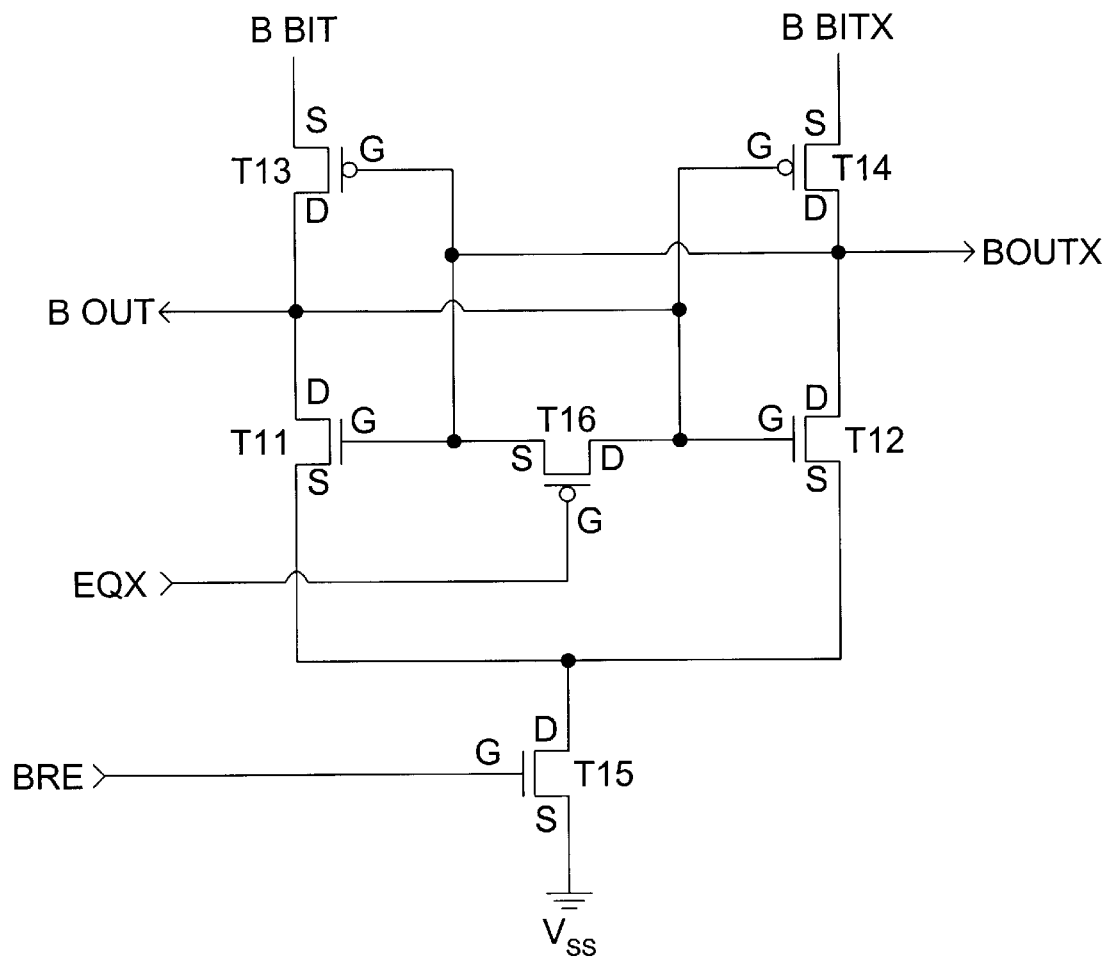
FIG. 3 is a circuit drawing of a preferred embodiment of an improved current sense amplifier.

FIG. 3 is a circuit drawing of a preferred embodiment of an improved current sense amplifier. The improved current sense amplifier is preferably comprised of three PMOS transistors and three NMOS transistors. PMOS transistors T13 and T14 perform the sense operation. PMOS transistors T13, T14 and NMOS transistors T11, T12 and T15 perform the amplify operation. Transistors T11, T12, T13 and T14 form a cross-coupled inverter circuit that is enabled by T15. PMOS transistor T16 performs the equalize operation.

The source node of PMOS transistor T13 is connected to a bit line, BBIT. The drain node of T13 is connected to the drain node of NMOS transistor T11 and to an output line, BOUT. The gate nodes of T11 and T13 are connected together and to an inverse output line, BOUTX.

The source node of PMOS transistor T14 is connected to an inverse bit line, BBITX. The drain node of T14 is connected to the drain node of NMOS transistor T12 and to the BOUTX line. The gate nodes of T12 and T14 are connected together and to the BOUT line.

The source nodes of T11 and T12 are connected to the drain node of NMOS transistor T15. The gate node of T15 is connected to a read enable line, BRE. The drain node of T15 is connected to Vss, the circuit ground.

The drain node and the source node of a PMOS transistor T16 are connected to the BOUT and BOUTX lines, respectively. The drain node and the source node of T16 perform similar functions and are interchangeable in alternate embodiments (i.e., the drain node of T16 may be connected to the BOUTX line while the source node of T16 may be connected to the BOUT line). The gate node of T16 is connected to an equalize line, EQX.

Figure 1:
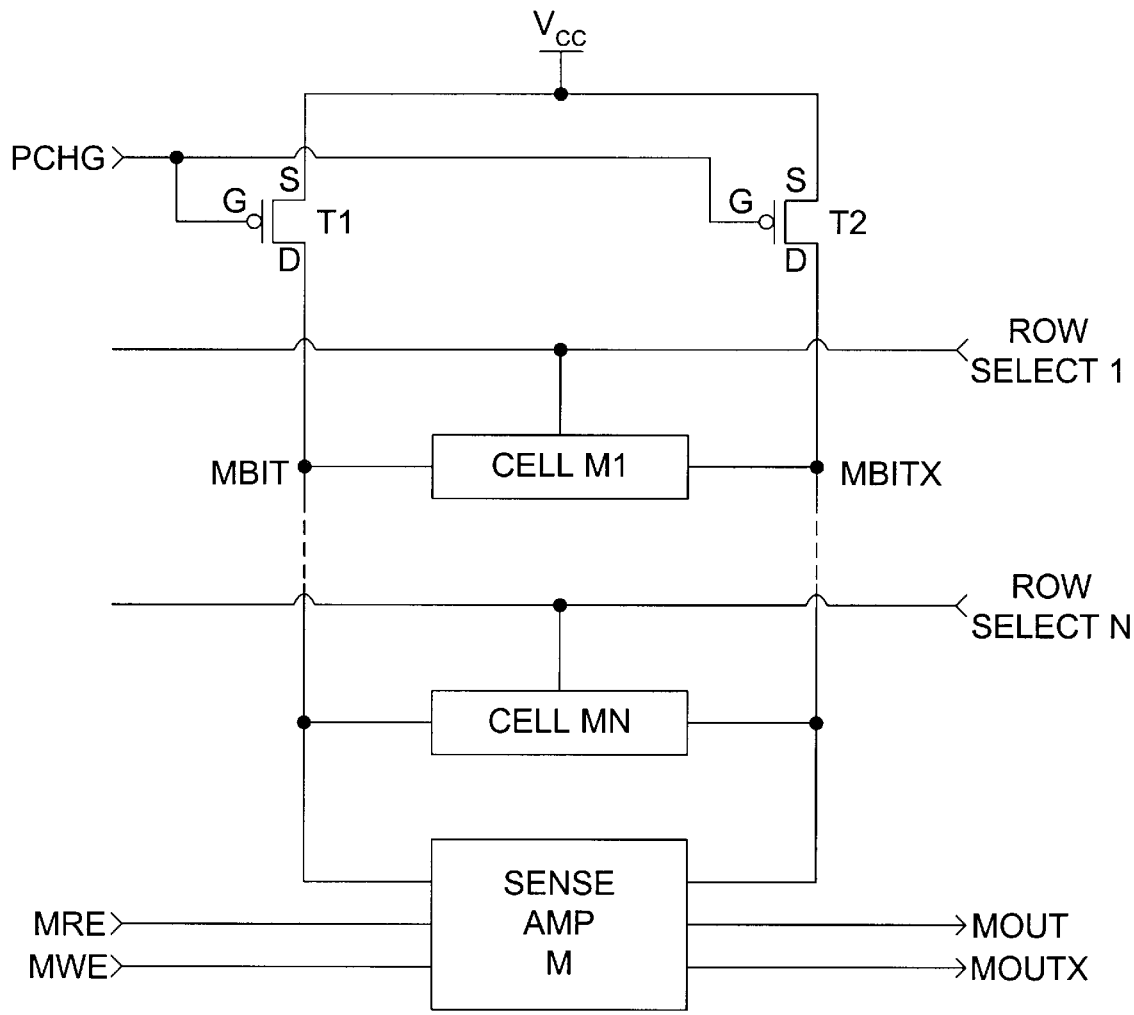
FIG. 1 is a circuit drawing of a typical RAM array used by a preferred embodiment of the invention.

Preferably, the described current sense amplifier is used in the typical RAM array configuration of FIG. 1. The bit lines, BBIT and BBITX, of FIG. 3 typically would connect to the bit lines, MBIT and MBITX, of FIG. 1, respectively. The read enable line, BRE, of FIG. 3 typically would connect to the read enable line, MRE, of FIG. 1. The EQX line is low when a cell is not selected and the read enable line BRE is not active. The write enable line, MWE, of FIG. 1 is not connected in the improved current sense amplifier of FIG. 3.

There are four major operations that occur in the optimized sense amplifier of the present invention: precharging, sensing, amplifying and equalizing. In the preferred embodiment, precharging of the bit lines BBIT and BBITX to approximately Vcc occurs at all times except when a write operation is active. Sensing of the value in the memory cell occurs when a cell is selected, and results in a small voltage difference on the output lines, BOUT and BOUTX. Amplifying of the small voltage difference on the BOUT and BOUTX lines occurs when the read enable line BRE is active (high). In the preferred embodiment, equalizing of the voltages on the output lines BOUT and BOUTX occurs at all times when a cell is not selected and the read enable line BRE is not active, i.e., when both sensing and amplifying are not occurring.

At all times except when a write operation is occurring, the PCHG line of FIG. 1 is asserted to keep the source voltage of the pull-up PMOSes (T1 and T2 of FIG. 1) at Vcc level, thereby precharging the bit lines BBIT and BBITX to approximately Vcc. Maintaining the bit lines at a near Vcc level increases the noise immunity of the memory cells.

When a cell is selected, the sensing operation begins. The bit lines BBIT and BBITX have a current difference due to the value in the selected cell, whereas one line is sinking current and the other is sourcing current. This creates a current difference flowing through T13 and T14, resulting in a small voltage difference on the output lines BOUT and BOUTX. Transistor T16 is OFF.

When the read enable line becomes active, the amplifying operation begins. After the read enable line BRE becomes active starting the read operation, T16 remains OFF, T15 turns ON, and the amplifying operation starts. Similar to the operation of the typical current sense amplifier in FIG. 2, the cross-coupled inverter circuit (T11, T12, T13 and T14) amplifies the small voltage difference on the output lines BOUT and BOUTX to the appropriate logic level. When the read enable line BRE is active high, the cross-coupled inverter circuit, enabled by T15, performs the amplifying operation. For example, if the value in the memory cell is a logic one, the voltage on the bit line BBIT is greater than the voltage on the inverse bit line BBITX. This causes T13 to be ON, T11 to be OFF, T14 to be OFF and T12 to be ON. As a result, the output line BOUT is pulled to Vcc, i.e. the BOUT line has a logic value of one, and the inverse output line, BOUTX, is pulled to Vss, i.e., the BOUTX line has a logic value of zero.

At all times when the read enable line BRE is not active and a cell is not selected, the equalizing operation occurs. T15 is OFF, T16 is ON, T11 and T12 are OFF, and T13 and T14 are ON. The output lines BOUT and BOUTX begin with the values acquired in the previous cycle. Current flows through T16 toward the output line with the lower voltage (BOUT or BOUTX). Current continues to flow until steady state and the voltages of the output lines BOUT and BOUTX are equal at approximately midpoint between Vcc and Vss. The equalize operation equalizes the voltages on the output lines to a midpoint voltage, thereby enabling both output lines to need to transition only half a rail—one line to Vcc and one line to Vss—during the amplifying operation of the next read operation. The current sense amplifier of FIG. 2 pulls both of the output lines down to Vss (ground) prior to a read, thereby causing one of the output lines to transition the full rail to Vcc during the amplification operation of the next read operation.

Figure 2:
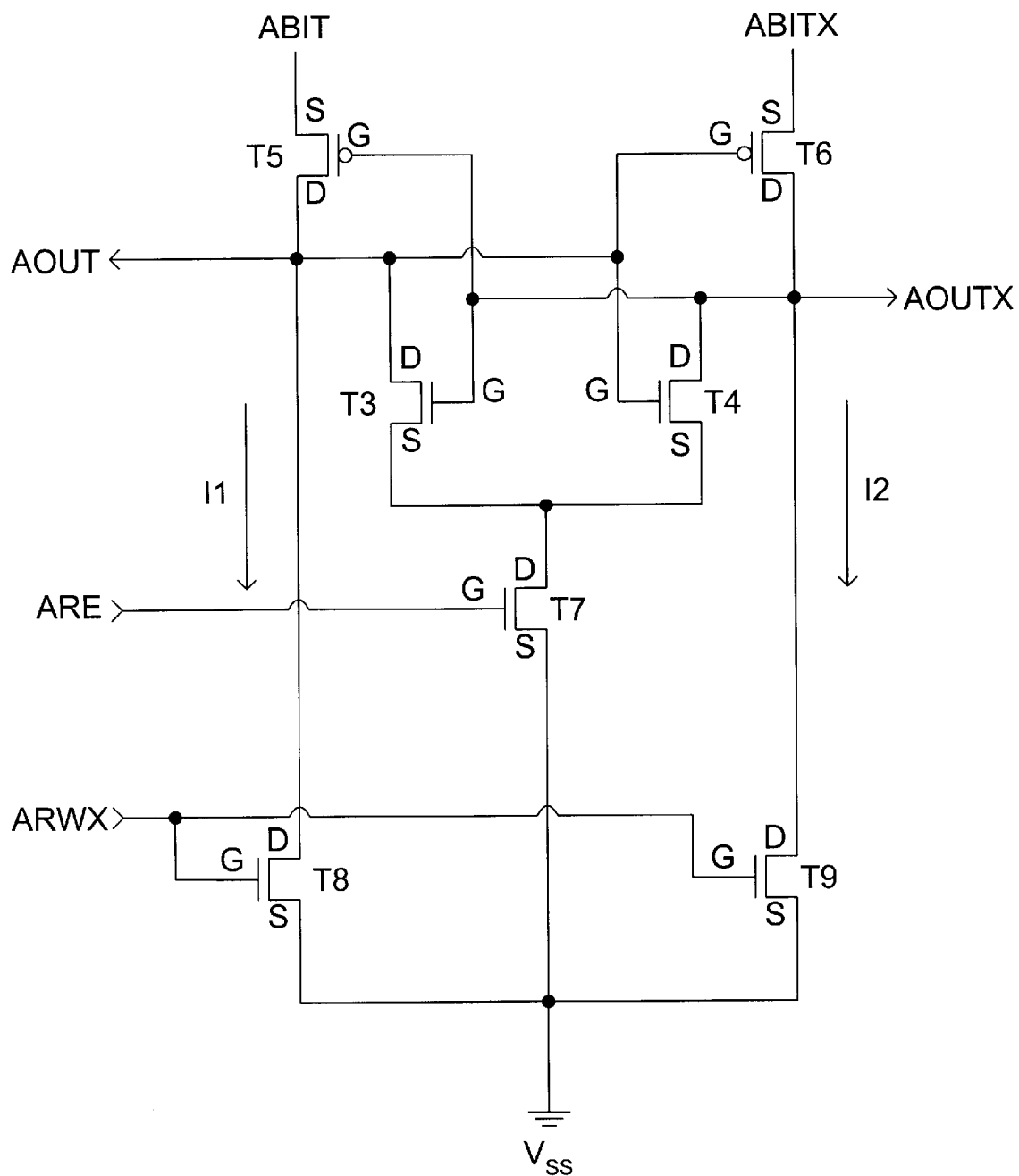
FIG. 2 is a circuit drawing of a typical prior art current sense amplifier.
Figure 4:
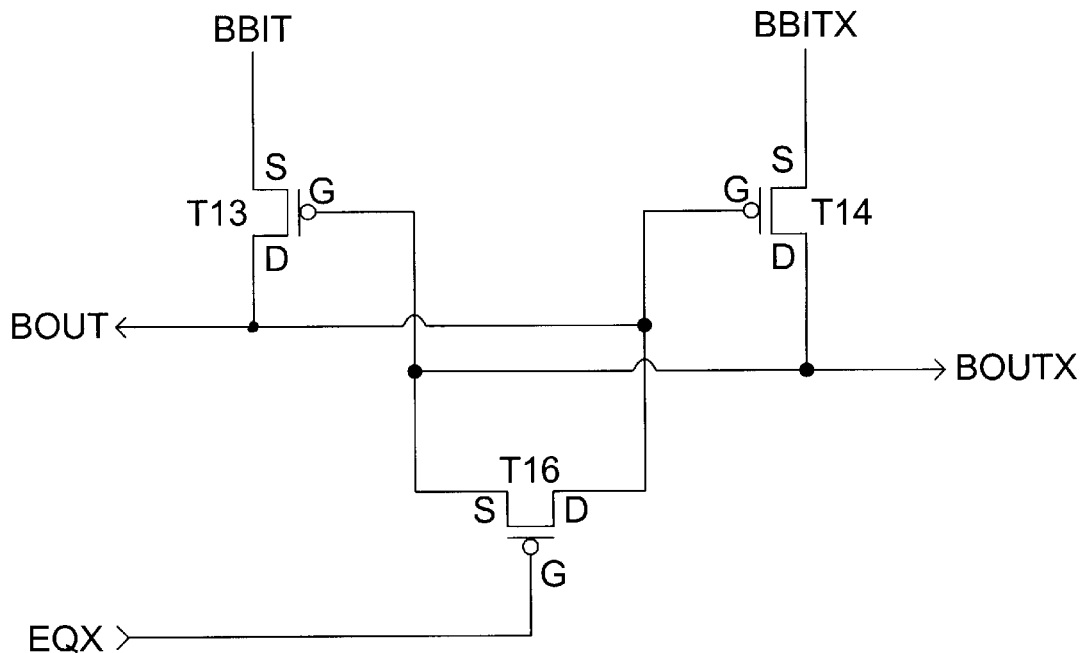
FIG. 4 is a circuit drawing of the portion of the sense amplifier circuitry of FIG. 3 that performs the sensing and equalizing function.

FIG. 4 is a circuit drawing of the portion of the sense amplifier circuitry of FIG. 3 that performs the sensing and equalizing operations, transistors T13, T14 and T16. When sensing and amplifying operations are not occurring, the EQX line is active (low), the equalizing operation occurs, and the voltage level on the bit line BOUT is approximately equal to the voltage on the inverse bit line BOUTX. This voltage is midway between Vcc and Vss. When a cell is selected, the current difference on the bit lines from the selected cell results in a small voltage difference on the output lines, BOUT and BOUTX. Whereas the output lines AOUT and AOUTX of the prior art current sense amplifier of FIG. 2 are pulled down to Vss during the precharge operation, the equalizing transistor T16 of the current sense amplifier of the present invention equalizes the voltage on the output lines BOUT and BOUTX to a midpoint voltage between Vcc and Vss. By having the output lines at a midpoint voltage, the current sense amplifier of the present invention reduces access times since the output lines only need to transition half a rail, to Vcc or Vss during the amplifying operation.

Figure 5:
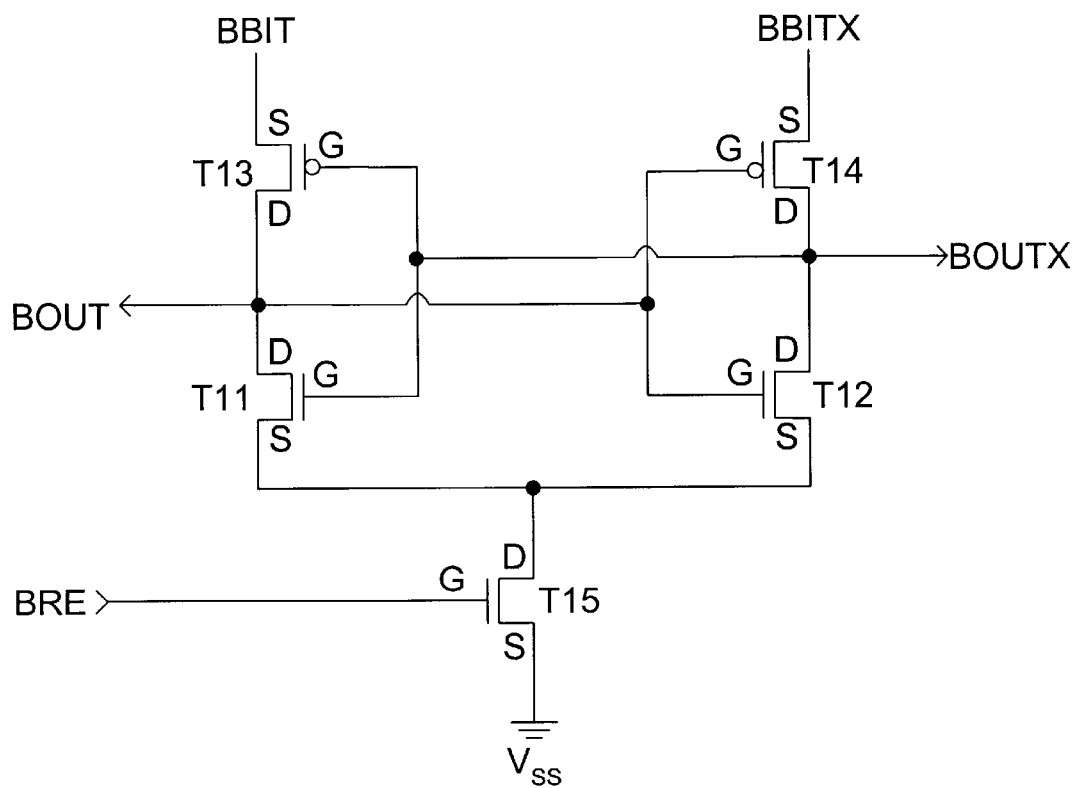
FIG. 5 is a circuit drawing of the portion of the sense amplifier circuitry of FIG. 3 that performs the amplifying function.

FIG. 5 is a circuit drawing of the portion of the sense amplifier circuitry of FIG. 3 that performs the amplifying function, T11, T12, T13, T14 and T15. T11, T13 and T12, T14 form a cross coupled inverter circuit. When the read enable line BRE is active high, the cross coupled inverter circuit, enabled by T15, performs the amplifying function.

As described above, the current sense amplifier of the present invention improves read access times over prior art current sense amplifiers. Other advantages over prior art current sense amplifiers include optimized power dissipation and reduced silicon area.

During a read operation, the output lines BOUT and BOUTX of the present invention charge and discharge by voltages smaller than those required if BOUT and BOUTX were to start from the full rail values of Vss or Vcc. The time required by the amplifier to amplify the difference between the lines is reduced, decreasing the access times for reads of the RAM array in the preferred embodiment of the present invention.

The number of transistors ON for the read operation is the same in both the typical sense amplifier of FIG. 2 and the preferred embodiment of the present invention of FIG. 3. While not performing a read or write operation, the static power dissipation for the typical prior art sense amplifier is greater than that of the present invention. In the typical prior art sense amplifier when read enable, ARE, is not active, T8 and T9 of FIG. 2 are fully ON with the maximum current flowing through the transistors. In the sense amplifier of the preferred embodiment of the present invention, T16, T13 and T14 of FIG. 3 are partially ON, with less than maximum current flowing until steady state is achieved when current stops flowing.

The sense amplifier of the present invention requires only six transistors to implement whereas the typical current sense amplifier of FIG. 2 requires seven. While this is only one transistor difference between the two sense amplifiers, the savings is per column and as RAM arrays increase in size the area of silicon saved can be significant.

With the introduction of an equalizing circuit, the preferred embodiment of the present invention reduces access time, reduces static power consumption, and silicon area used over conventional current sense amplifiers.

As would be apparent to those of ordinary skill in the art, the use of an equalizing function may be used in other conventional memory circuits to decrease transition times of various lines. These memory circuits may include registers, various cache arrays, flip flops and other circuits which detect values on given signal lines.

Although the present invention has been fully described above with reference to specific embodiments, other alternative embodiments will be apparent to those of ordinary skill in the art. Therefore, the above description should not be taken as limiting the scope of the present invention which is defined by the appended claims.

What is claimed is:

1. A sensing circuit comprising:
   (a) a first output line and a second output line for receiving a sensed difference voltage from a column bit line and an inverse column bit line at a first selected period of time; and
   (b) an equalizer for equalizing the voltage on said first and second output lines for a second selected period of time.

2. The sensing circuit of claim 1, further comprising a means for amplifying the sensed difference voltage on said first and second output lines for a third selected period of time.

3. The sensing circuit of claim 1, wherein the equalized voltage is approximately midway between Vcc and Vss.

4. The sensing circuit of claim 2, wherein the third selected period of time does not overlap the second selected period of time.

5. The sensing circuit of claim 2, wherein the first selected period of time does not overlap the second selected period of time.

6. The sensing circuit of claim 2, further comprising an input line, a column bit line and an inverse column bit line, wherein said equalizer comprises:
   (a) a first PMOS transistor with a source node coupled to said column bit line, a drain node coupled to said first output line, and a gate node coupled to said second output line;
   (b) a second PMOS transistor with a source node coupled to said inverse column bit line, a drain node coupled to said second output line, and a gate node coupled to said first output line; and
   (c) a third PMOS transistor with one of a source node or drain node coupled to the gate node of the first PMOS transistor and the remaining node coupled to the gate node of the second PMOS transistor, and a gate node coupled to an input line such that when the input line is a logic low, the means for equalizing is enabled and the voltage on said first output line and said second output line transitions to a midpoint voltage, equalizing the voltage on said first and second output lines.

7. The sensing circuit of claim 6, further comprising a read enable line, wherein said means for amplifying a sensed difference voltage and placing amplified voltage on said first and second output lines comprises:
   (a) a first NMOS transistor with a drain node coupled to said first output line, a gate node coupled to said second output line and a source node;
   (b) a second NMOS transistor with a drain node coupled to said second output line, a gate node coupled to said first output line, and a source node coupled to the source node of said first NMOS transistor; and
   (c) a third NMOS transistor with a drain node coupled to the source nodes of said first and second NMOS transistors, a gate node coupled to said read enable line, and a drain node coupled to Vss.

8. The sensing circuit of claim 3, further comprising:
   (a) a memory bit cell for storing a value;
   (b) said column bit line coupled to said memory bit cell wherein during a read operation, said memory cell places the stored value on said column bit line; and
   (c) said inverse column bit line coupled to said memory bit cell wherein during a read operation, said memory cell places the inverse of the stored value on said inverse column bit line;

wherein the difference in value on said column bit line and on said inverse column bit line is sensed and said sensed difference voltage is placed on said first output line and said second output line for a period of time when said equalizer is not enabled.

9. The sensing circuit of claim 8, wherein said equalizer comprises:
   (a) a first PMOS transistor with a source node coupled to said column bit line, a drain node coupled to said first output line, and a gate node coupled to said second output line;
   (b) a second PMOS transistor with a source node coupled to said inverse column bit line, a drain node coupled to said second output line, and a gate node coupled to said first output line; and
   (c) a third PMOS transistor with one of a source node or drain node coupled to the gate node of the first PMOS transistor and the remaining node coupled to the gate node of the second PMOS transistor, and a gate node coupled to said input line such that when said input line is a logic low, the equalizer is enabled and the voltage on said first output line and said second output line transitions to a midpoint voltage, equalizing the voltage on both lines.

10. The sensing circuit of claim 9, further comprising an amplification circuit for amplifying a voltage difference on said first output line and said second output line to standard output levels for a period of time when said equalizing circuit is not enabled.

11. A method of sensing a stored value comprising:
   (a) sensing the values on a bit line and an inverse bit line and placing a corresponding voltage difference on an output line and an inverse output line; and
   (b) equalizing the voltages on the output line and the inverse output line to an equal voltage, midway between Vcc and Vss.

12. The method of sensing a stored value of claim 11, further comprising:
   (a) precharging the bit line and the inverse bit line to near Vcc levels prior to said step of sensing the values on the bit line and the inverse bit line; and
   (b) after said step of placing the corresponding voltage difference on the output line and the inverse output line, amplifying to standard output levels the corresponding voltage difference on the output line and the inverse output line.

13. The method of claim 11 wherein said step of equalizing the voltages on the output line and the inverse output line comprises coupling one of a source node or drain node of a PMOS transistor to the output line and coupling the remaining node of the PMOS transistor to the inverse output line, and coupling a gate node of the PMOS transistor to an enable line, wherein said step of equalizing the voltages is not performed when the enable line is not active and wherein said step of equalizing the voltages is performed when the enable line is active.

* * * * *